United States Patent
Kikuchi et al.

(10) Patent No.: US 6,232,562 B1
(45) Date of Patent: May 15, 2001

(54) HYBRID INTEGRATED CIRCUIT DEVICE

(75) Inventors: Kiichi Kikuchi, Maebashi; Yuji Ebinuma, Misato-Machi; Yasuo Hosaka, Maebashi; Yoshiyuki Wasada, Tamamura-machi; Kenji Kaneta, Tomioka; Hajime Hasegawa, Tamamura-machi; Mitsuaki Ootani, Maebashi, all of (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/406,717

(22) Filed: Sep. 28, 1999

(30) Foreign Application Priority Data

Sep. 30, 1998 (JP) .................................................. 10-277412
Jul. 14, 1999 (JP) .................................................. 11-200928

(51) Int. Cl.[7] ............................... H05K 1/16; H02G 3/08
(52) U.S. Cl. ..................... 174/260; 174/52.1; 174/255; 174/261; 361/760; 361/807
(58) Field of Search .................................. 174/260, 52.1, 174/250, 256, 258, 261; 361/760, 807, 718, 679, 748, 783, 728, 736, 764; 257/531; 336/192; 29/602.1, 605

(56) References Cited

U.S. PATENT DOCUMENTS

| | | | |
|---|---|---|---|
| 4,249,229 | * | 2/1981 | Hester .................................. 361/752 |
| 4,939,494 | * | 7/1990 | Masuda et al. ........................ 336/96 |
| 5,157,368 | * | 10/1992 | Okano et al. .......................... 336/90 |
| 5,351,167 | * | 9/1994 | Wai et al. ............................. 361/760 |
| 5,373,276 | * | 12/1994 | Suppelsa et al. ...................... 336/65 |
| 5,375,035 | * | 12/1994 | Stoddard ............................ 361/306.2 |
| 6,157,283 | * | 12/2000 | Tsunemi ............................... 336/192 |

FOREIGN PATENT DOCUMENTS

11345723 * 12/1999 (JP) .

* cited by examiner

*Primary Examiner*—Jeffrey Gaffin
*Assistant Examiner*—I B Patel
(74) *Attorney, Agent, or Firm*—Townsend & Banta

(57) ABSTRACT

A hybrid integrated circuit device is provided which suppresses lowering of the inductance value of a mounted coil component. A hybrid integrated circuit device according to the present invention has such a structure that a wiring pattern is provided on at least one main face of a substrate, a laid core type coil component is mounted on at least one main surface of the substrate, and a conductor pattern including a ground pattern is provided at least either on a main face opposite to the surface of the substrate upon which the laid core type coil component is mounted or in an interior of the substrate. In particular, the hybrid integrated circuit device has a configuration such that a magnetic flux passing window, having an absence of ground pattern, is provided in an orthographic projection area corresponding to a winding portion of the coil component in the conductor pattern.

4 Claims, 7 Drawing Sheets

HYBRID INTEGRATED CIRCUIT DEVICE

FIELD OF THE INVENTION

The present invention relates to a hybrid integrated circuit device in which a laid core type coil component having a low profile (low height) is mounted on a substrate, and in particular to a configuration of a conductor pattern provided on the substrate upon which the laid core type coil component is mounted.

BACKGROUND OF THE INVENTION

As electronic devices such as portable information terminals have become light, thin and small in recent years, hybrid integrated circuit devices (so-called hybrid ICs) have been used in abundance in such products. In each hybrid integrated circuit device, electronic components, such as capacitors, transistors, transformers, and ICs, forming one circuit block, such as DC-DC converters, are mounted on one high density substrate by using the surface mounting method.

As a matter of course, individual electronic components of hybrid integrated circuit devices must be very small in size and low in height. Specifically, it is necessary to decrease the height of coil components (such as transformers, filters, choke coils), which tend to have relatively large height dimensions. As a result, a laid core type coil component 10, as shown in FIG. 6, has been devised.

This laid core type coil component 10 consists of a ferrite core 5, which has a flattened-columnar wound core portion (represented by a broken line) 2 and collars 3 and 4, formed integrally with the wound core portion 2, on both ends of the longitudinal direction of the wound core portion 2; a plurality of external electrodes 6 provided on end faces of the collars 3 and 4 of the ferrite core 5; and a winding 8 composed of an insulation covered conductor (such as a polyurethane covered conductor or a polyester covered conductor) wound around the winding core portion 2 of the ferrite core 5 and conductively bonded to the external electrodes 6 of the collars 3 and 4, respectively, at ends thereof, by thermo-compression bonding or the like.

In general, spacing between the collars 3 and 4 located at both ends is relatively wide, and a winding portion 9, composed of wound core portion 2 and winding 8, is positioned extremely close to a substrate. Such a configuration can be seen in FIG. 7, a side view of the laid core type coil compound 10 shown in FIG. 6 which further shows the previously described state of mounting on the substrate, as well as the magnetic flux B (i.e., magnetic lines of force) which terminate at collars 3 and 4, and emanate above and below the winding portion 9.

Various materials may be utilized for formation of the substrate 11, used for mounting of the hybrid integrated circuit device, such as alumina or glass epoxy. Typically, electrode lands 14 and a wiring pattern 12 are provided on one main surface of the substrate 11 (obverse of the substrate), and the laid core type coil component 10 and other chip components are surface mounted on the substrate by solder reflow or the like. In addition, a conductor pattern including a ground pattern 13 is provided on the opposite surface of the substrate, or in the interior of the substrate. Furthermore, multilayer substrates each having a number of conductor patterns, such as wiring patterns and ground patterns, formed within the substrate as a laminate, are frequently used. The conductor material for the conductor patterns, such as the wiring pattern 12 and the ground pattern 13, is usually aluminum, copper foil, silver foil, gold foil, silver-palladium, or the like.

Typically, in the conventional hybrid integrated circuit device as described above, the conductor pattern including the ground pattern 13 is provided as a coating, layer or plane on the reverse of the substrate to the laid core type coil component, or in the interior of the substrate, in as wide a layer as possible, in order to intensify the ground potential as a noise countermeasure as shown in FIG. 7. Since the magnetic flux B heading from collars 3 and 4 emanates above and below the winding as described above, the laid core type coil component 10 is affected by the conductor pattern, such as the ground pattern 13, in a region located right under the winding portion 9. As a result, the inductance value of the coil component 10 is lowered by approximately 10 to 30% as compared with the inductance valve before mounting.

In addition, the inductance value of the coil component 10 also may be affected by the peripheral environment of the substrate 11 on which the coil component 10 is mounted, such as the shape of the conductor pattern located directly under the wiring portion 9, and arrangement of the peripheral electronic components. Therefore, it is difficult to accurately determine beforehand the inductance value of the coil component after final mounting upon the substrate and placement of peripheral electronic components upon the substrate.

SUMMARY OF THE INVENTION

The present invention has been made in view of solving the above described deficiencies of conventional hybrid integrated circuit devices. An object of the present invention is to provide a hybrid integrated circuit device having a conductor pattern which avoids decrease of the inductance value of the laid core type coil component mounted on the hybrid integrated circuit device, and which allows adjustments of the laid core type coil component after the coil component is mounted on the substrate in order to achieve the desired inductance valve.

The present invention achieves the above described object by providing a first embodiment of a hybrid integrated circuit device having electrode lands on at least one main face of a substrate, a laid core type coil component mounted on at least one main face of the substrate, and a conductor pattern including a ground pattern provided on at least either a main surface of the substrate opposite the main face upon which the laid core type coil component is mounted or in an interior of the substrate, wherein a magnetic flux passing window having an absence of ground pattern, is provided in an orthographic projection area Z corresponding to a winding portion of the coil component in the conductor pattern.

Furthermore, the present invention achieves the above described object by providing a second embodiment of a hybrid integrated circuit device having electrode lands on at least one main face of a substrate, a laid core type coil component mounted on at least one main face of the substrate, and a conductor pattern including a ground pattern provided on at least either a main surface opposite the face upon which the laid core type coil component is mounted on the substrate or in the interior of the substrate, wherein a magnetic flux passing window having an absence of the ground pattern, is provided in an orthographic projection area Z corresponding to a winding portion of the coil component in the conductor pattern, and an extending portion of a wiring pattern extends in the orthographic projection area Z of the winding portion.

The present invention also achieves the above described object by providing a third embodiment of a hybrid integrated circuit device having electrode lands on at least one main face of a substrate, a laid core type coil component on at least one main face of the substrate, and a conductor pattern provided on at least either a main surface opposite the face upon which the laid core type coil component is mounted on the substrate or in the interior of the substrate, wherein a magnetic flux passing window having an absence of conductor pattern is provided in an orthographic projection area corresponding to a winding portion of the coil component in the conductor pattern.

The present invention also achieves the above described object by providing a fourth embodiment of a hybrid integrated circuit device having at least a laid core type coil component mounted on one main surface of a substrate, wherein a conductor pattern for inductance adjustment of the coil component is provided on an orthographic projection area corresponding to a main surface opposite to the one main surface upon which the winding portion of the laid core type coil component is mounted on the substrate.

DETAILED DESCRIPTION OF THE INVENTION

Figure 1:
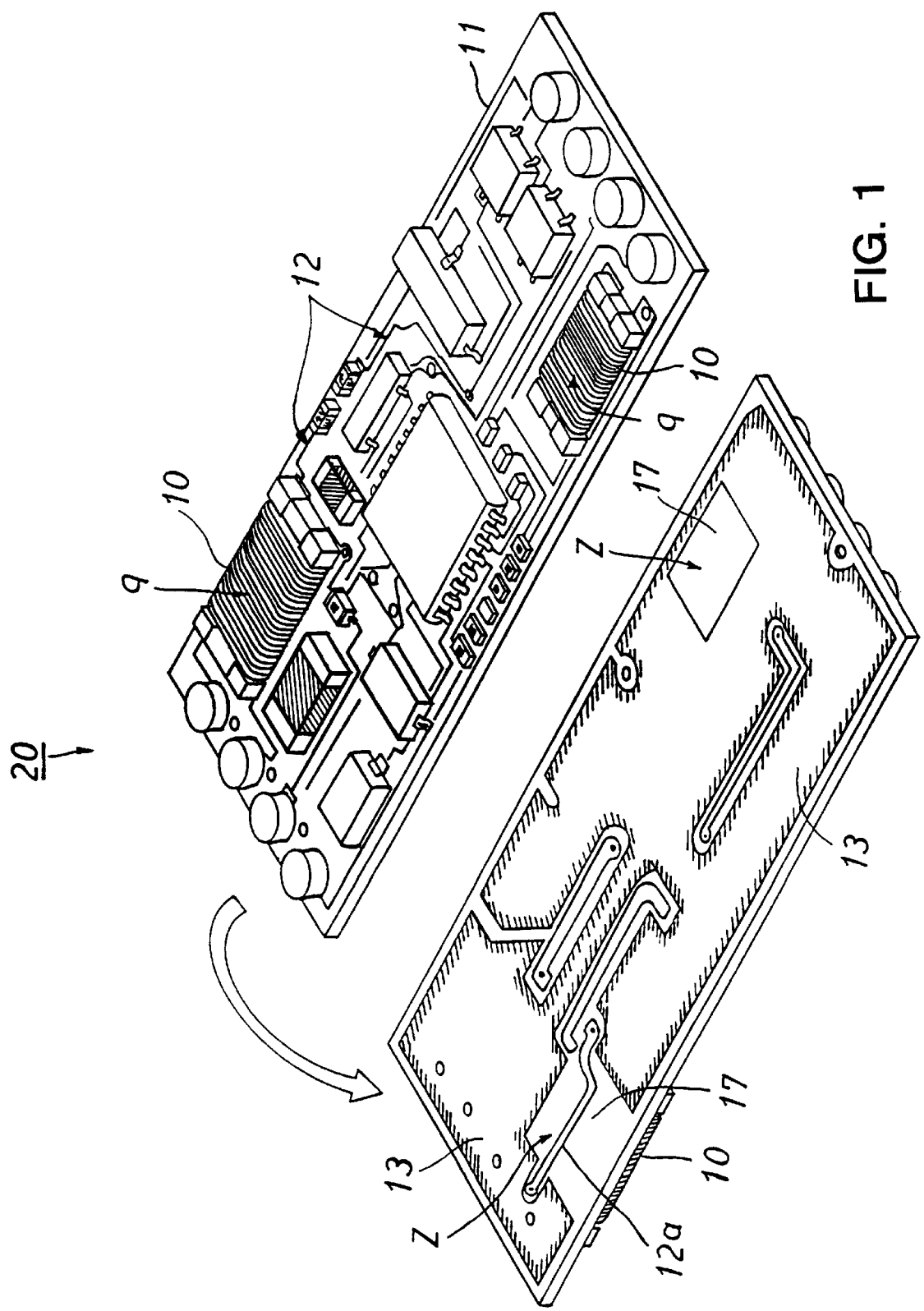
FIG. 1 is a perspective view of the hybrid integrated circuit device according to the first embodiment of the present invention, and a reverse thereof.

As shown in FIG. 1, a hybrid integrated circuit device 20 according to the first and second embodiments of the present invention has a wiring pattern 12 provided on at least one main face of a substrate 11, a laid core type coil component 10 mounted on at least one main surface of the substrate 11, and a conductor pattern including a ground pattern 13 provided on at least either a main face of substrate 11 opposite to the surface upon which the laid core type coil component 10 is mounted or in an interior of the substrate. In particular, the hybrid integrated circuit device 20 of the present invention is characterized in that a magnetic flux passing window 17 having an absence of ground pattern 13 is provided in an orthographic projection area Z corresponding to a winding portion 9 of the coil component 10 in the above described conductor pattern.

Figure 2:
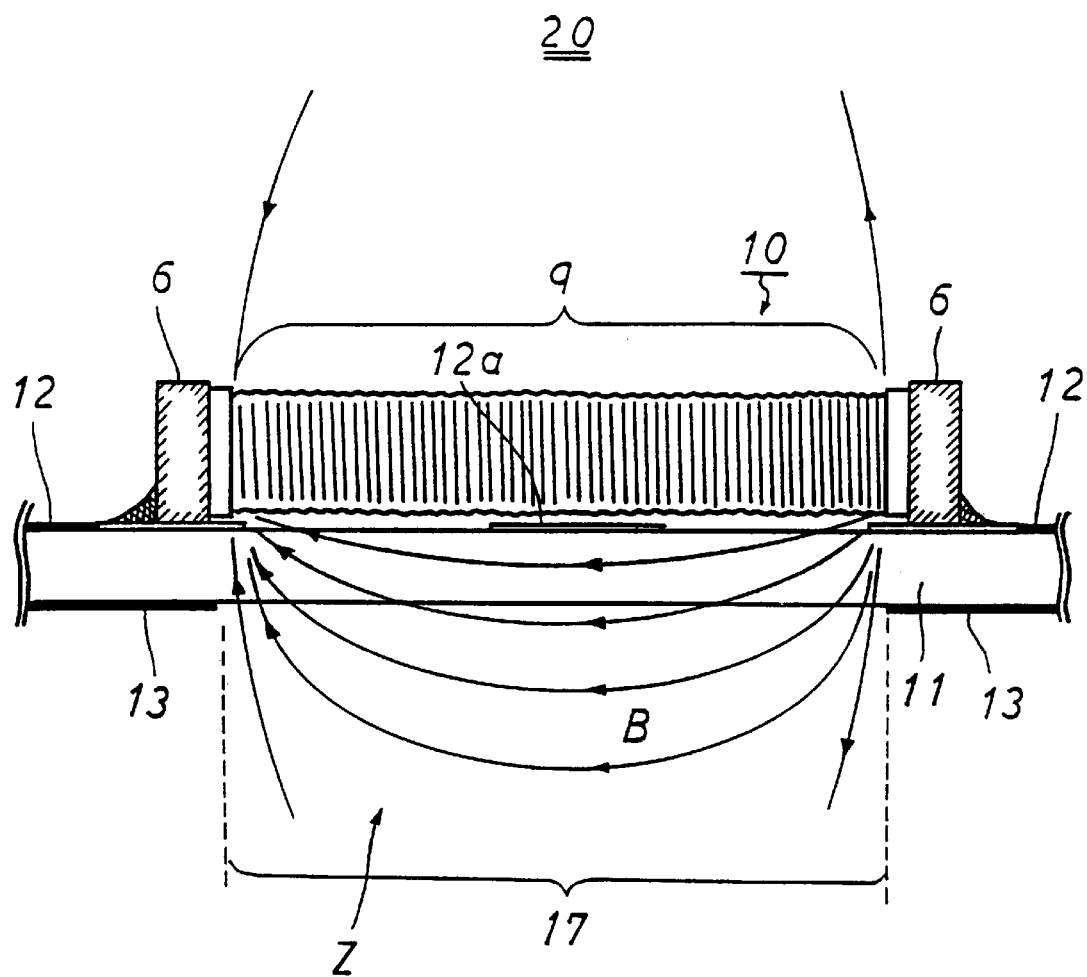
FIG. 2 is a side view of a coil component mounting portion of the hybrid integrated circuit device shown in FIG. 1.

In the above described hybrid integrated circuit device 20, as shown in FIG. 2, the magnetic flux B emanating directly under the winding portion 9 of the thin, flat laid core type coil component 10 generally passes through the magnetic flux passing window 17 having an absence of ground pattern 13. Therefore, the magnetic flux B is barely influenced by the ground pattern 13, and, consequently, it is possible to avoid decrease of the inductance value of the coil component 10 of the hybrid integrated circuit device 20 of the present invention, a problem present in conventional hybrid ICs.

The above described hybrid integrated circuit device 20 according to the first aspect of the present invention has a configuration such that only the ground pattern located in an orthographic projection area Z corresponding to the winding portion 9 largely influencing the inductance value of the coil component 10, is removed via formation of the magnetic flux passing window 17. Therefore, due to restriction on space for the wiring pattern, in the second embodiment herein, an extending portion 12a of the wiring pattern 12 is formed on one main face of the substrate 11 upon which the coil component 10 is mounted, which extends in the orthographic projection area Z corresponding to the winding portion 9. Even in this case, the ground pattern, which is the most widely formed conductor pattern, is completely removed in the orthographic projection area Z corresponding to the winding portion of the coil component. The removal of the ground pattern by formation of a magnetic flux passing window 17 has a great effect upon reducing the influence of the winding portion 9 on the inductance value.

Figure 3:
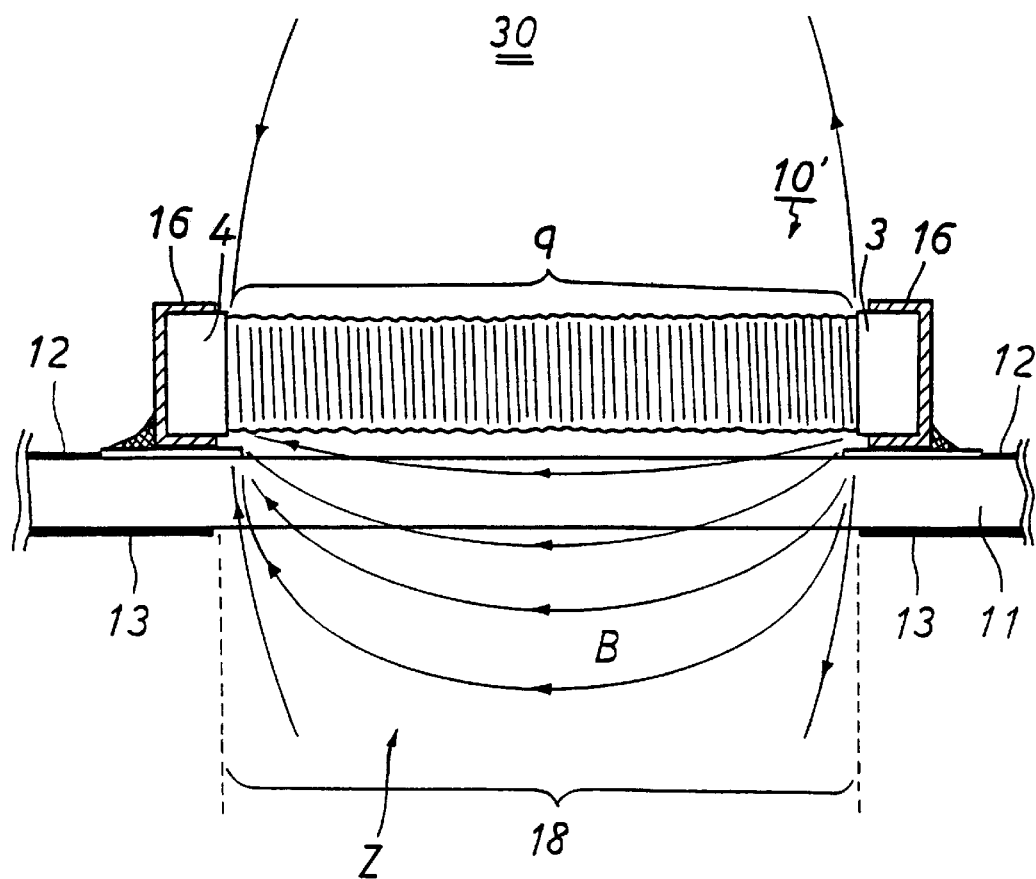
FIG. 3 is a side view of a coil component mounting portion of a hybrid integrated circuit device according to the third embodiment of the present invention.

In such cases where there is no interference of the wiring pattern 12 as described above, i.e., in a hybrid integrated circuit device 30 of the third embodiment of the present invention having a magnetic flux passing window 18 corresponding to the winding portion 9 of the coil component 10', the magnetic flux B emanating directly under the winding portion 9 of the coil component 10' passes through the magnetic flux passing window 18, as shown in FIG. 3. As a result, there is little influence on the inductance value of the coil component 10 by the ground pattern 13. In FIG. 3, a coil component 10' is shown having a plurality of external electrodes 16, each composed of a metal plate fitted to the collars 3 or 4 of the ferrite core, in contrast to laid core type coil component 10' which has external electrodes 6, directly fixed to the core. However, it should be understood that both coil components are laid core type coil components, which is the subject of the present invention.

Figure 4:
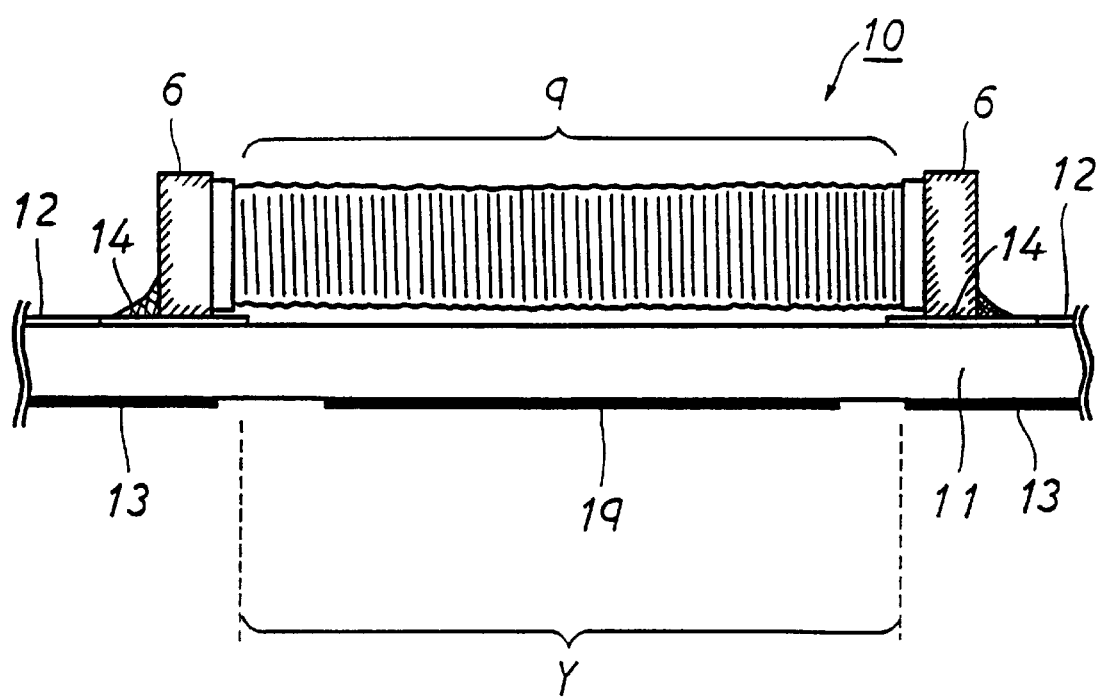
FIG. 4 is a side view of a coil component mounting portion of a hybrid integrated circuit device according to a fourth embodiment of the present invention.
Figure 5:
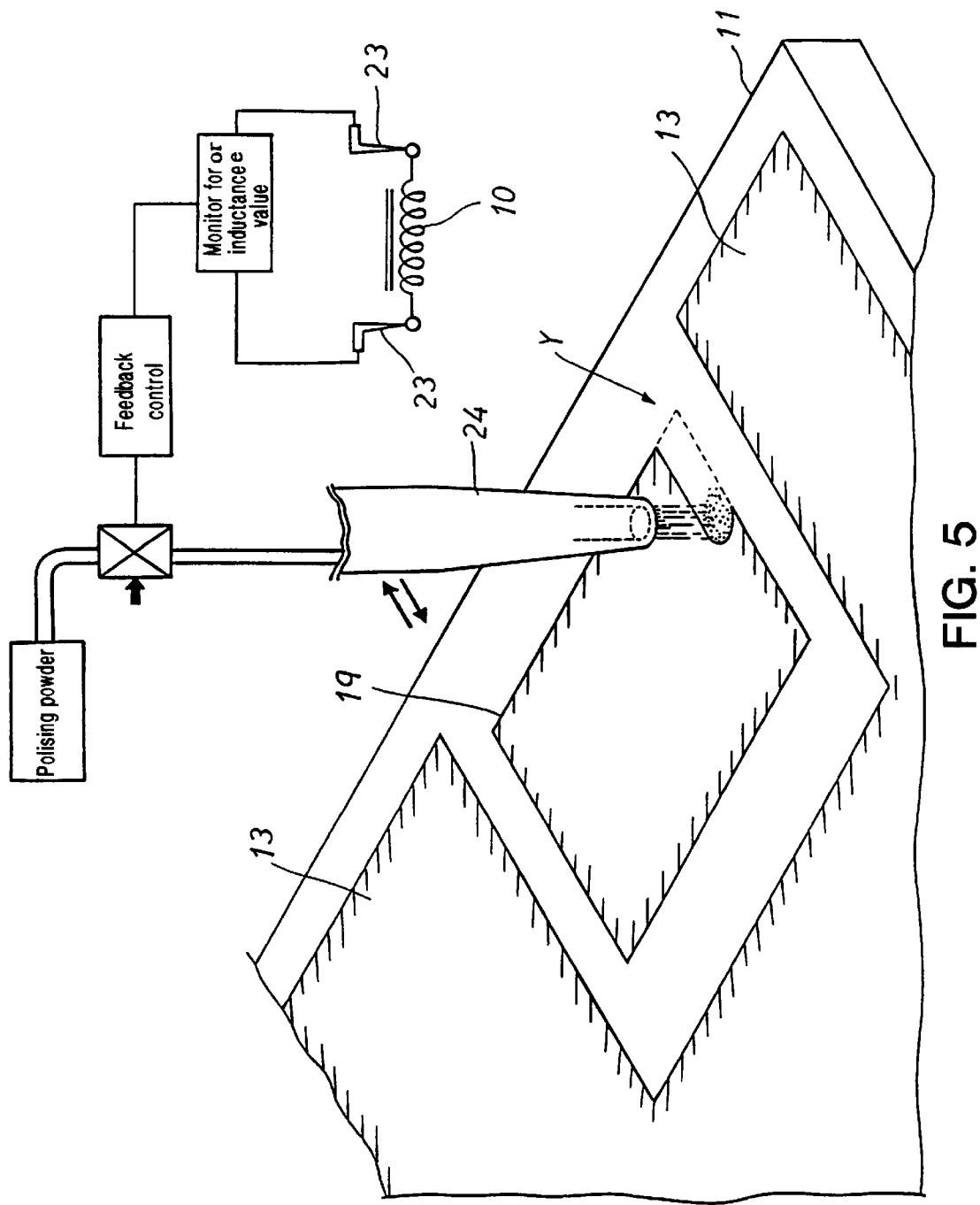
FIG. 5 is a perspective/system diagram of a method and apparatus for adjustment of inductance value in the hybrid integrated circuit device according to the fourth embodiment of the present invention.
Figure 6:
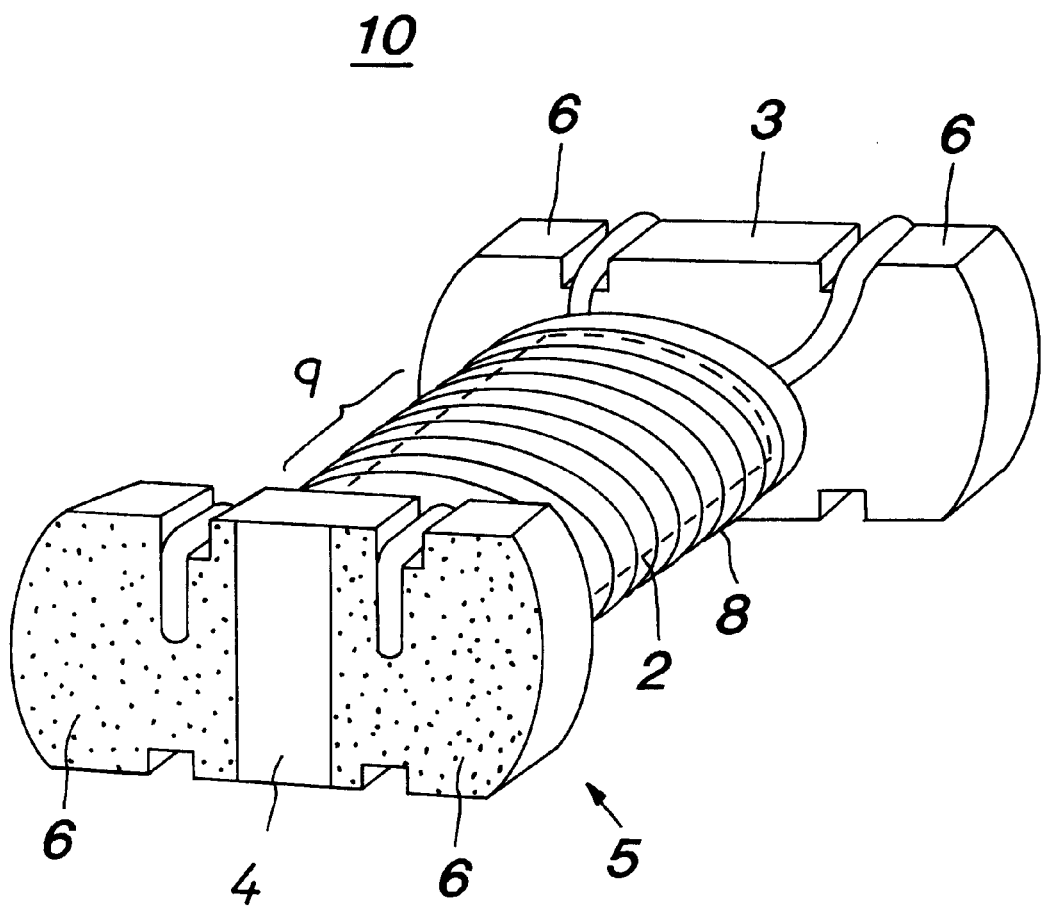
FIG. 6 is a perspective view of a conventional laid core type coil component.
Figure 7:
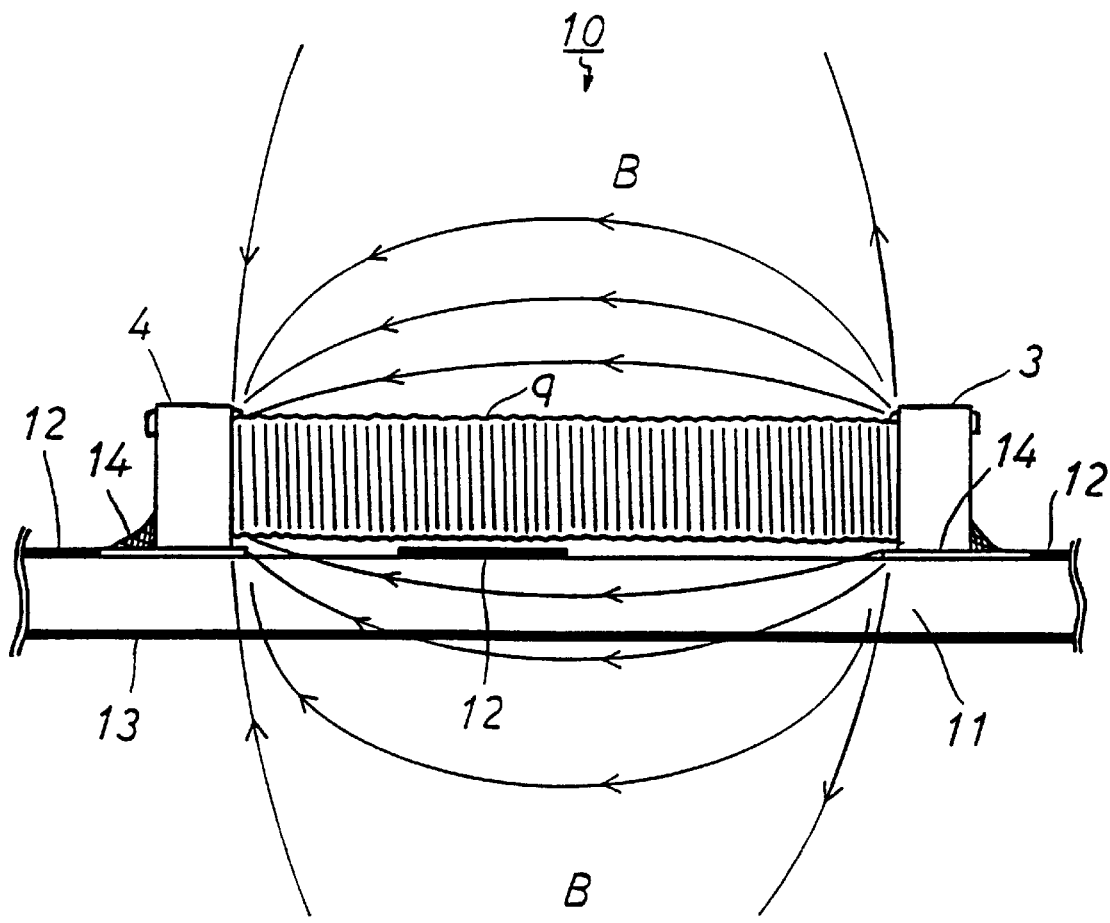
FIG. 7 is a side view of a mounting portion of a laid core type coil component in a hybrid integrated circuit device.

Furthermore, a hybrid integrated circuit device 40 according to the fourth embodiment of the present invention, as shown in FIG. 4, is characterized in that a conductor pattern 19 is provided for inductance adjustment of the coil component 10 in an orthographic projection area Y on the reverse surface of the substrate upon which the winding portion 9 of the coil component 10 is mounted. The conductor pattern 19 for inductance adjustment of the coil component 10 is independent of the ground pattern 13. After the coil component 10 has been mounted on the substrate 11, as shown in FIG. 5, a probe 23 is attached to an electrode of the coil component 10. While monitoring the inductance value, the conductor pattern 19 is selectively shaved by using a sand blasting method comprising jetting impalpable powder (sand) of alumina of approximately 5 to 50 $\mu$m at high speed, together with high pressure air, from a nozzle 24, in an appropriate formation. As a result, the degree of influence of the conductor pattern 19 on the inductance value in the mounted coil component 10 can be altered. Therefore, by adjusting the effective inductance value of the coil component 10, a desired inductance value is obtained.

The inventors of the present invention have theorized that the influence of the conductor pattern, such as the ground pattern and the wiring pattern of the substrate, of the hybrid integrated circuit device (hybrid IC) on the inductance value of the mounted coil component should be considered prior to mounting. Therefore, if it is determined that such patterns will be undesirable, alternate patterns may be used. In view of the shape of the coil component expected as the height of the coil component is lowered, the present invention has been created by searching for a solution to the problems which may be encountered in the future.

Thus, the hybrid integrated circuit according to the present invention provides (1) an excellent effect in that the influence of the conductor pattern on the inductance value of the laid core type coil component mounted on the substrate of the hybrid integrated circuit device is reduced, and, consequently, lowering of the inductance value can be suppressed; and (2) an excellent effect in that an adjustment of the laid core type coil component can be made after mounting on the substrate, in order that the coil component has a desired inductance value.

The new and novel circuit block of the hybrid integrated circuit device (hybrid IC) of the present invention includes every circuit block mounting a laid core type coil component. There is no restriction in its application to, for example, a DC-DC converter and a power amplifier. Furthermore, the kind of the mounted coil component is arbitrary so long as it has a profile, and various components such as a transformer, a choke coil, and a filter are contained therein.

Reference Numerals 2 winding core
3, 4 collar
5 ferrite core
6, 16 external electrode
8 winding
9 winding portion
10, 10' coil component
11 substrate
12 wiring pattern
13 ground pattern
14 electrode land
17, 18 magnetic flux passing window
19 conductor pattern
20, 30, 40 hybrid integrated circuit device
Z orthographic projection area corresponding to the winding portion of the coil component
Y Orthographic projection area of the main face opposite to the surface of the substrate above which the winding portion of the coil component is positioned

What is claimed is:

1. A hybrid integrated circuit device having electrode lands on at least one main face of a substrate, a laid core type coil component mounted on at least the one main face of the substrate, and a conductor pattern including a ground pattern provided on at least either a main surface of the substrate opposite said main face upon which the laid core type coil component is mounted or in an interior of the substrate, wherein a magnetic flux passing window, having an absence of ground pattern, is provided in an orthographic projection area corresponding to a winding portion of said coil component in said conductor pattern.

2. A hybrid integrated circuit device having electrode lands on at least one main face of a substrate, a laid core type coil component mounted on at least the one main face of the substrate, and a conductor pattern including a ground pattern provided on at least either a main surface opposite said main face upon which the laid core type coil component is mounted on the substrate or in an interior of the substrate, wherein a magnetic flux passing window, having an absence of ground pattern, is provided in an orthographic projection area corresponding to a winding portion of said coil component in said conductor pattern, and an extending portion of a wiring pattern extends in said orthographic projection area of the winding portion.

3. A hybrid integrated circuit device having electrode lands on at least one main face of a substrate, a laid core type coil component mounted on at least one main face of the substrate, and a conductor pattern provided on at least either a main surface opposite said main face upon which the laid core type coil component is mounted on the substrate or in an interior of the substrate, wherein a magnetic flux passing window, having an absence of conductor pattern, in an orthographic projection area corresponding to a winding portion of said coil component in said conductor pattern, is provided.

4. A hybrid integrated circuit device having at least a laid core type coil component mounted on one main surface of a substrate, wherein a conductor pattern for inductance adjustment of said coil component is provided in an orthographic projection area corresponding to a main surface opposite to said main surface upon which a winding portion of the laid core type coil component is mounted on said substrate.

* * * * *